United States Patent [19]

Abert

[11] 4,080,560
[45] Mar. 21, 1978

[54] METHOD AND APPARATUS FOR DETERMINING THE MAINTENANCE AND CHARGE CONDITION OF LEAD STORAGE BATTERIES

[75] Inventor: Michael Abert, Au (Rhine), Germany

[73] Assignee: Siemens Aktiengesellschaft, Munich, Germany

[21] Appl. No.: 775,438

[22] Filed: Mar. 8, 1977

[30] Foreign Application Priority Data

Mar. 12, 1976 Germany ............................ 2610536

[51] Int. Cl.² ...................... G01N 27/46; G08B 21/00
[52] U.S. Cl. ..................................... 324/29.5; 320/48; 340/249
[58] Field of Search .......................... 324/29.5; 320/48; 340/249

[56] References Cited

U.S. PATENT DOCUMENTS

| 3,500,167 | 3/1970 | Applegate et al. ................. 324/29.5 |
| 4,024,523 | 5/1977 | Arnold et al. .......................... 320/48 |
| 4,025,916 | 5/1977 | Arnold et al. .......................... 320/48 |

Primary Examiner—Robert J. Corcoran
Attorney, Agent, or Firm—Kenyon & Kenyon, Reilly, Carr & Chapin

[57] ABSTRACT

The maintenance condition of lead storage batteries is determined by measuring the no-load voltage, the voltage under a heavy current load and, subsequently thereto, measuring the recovery voltage at two instants spaced one second apart and by performing a qualitative comparison of the measurement results with predetermined reference voltages and making a logical evaluation of the comparison results.

8 Claims, 6 Drawing Figures

| | | | | |
|---|---|---|---|---|
| 0 | 0 | 1 | x | − |
| 0 | 0 | 0 | 1 | − |
| 1 | 0 | x | x | − |
| 0 | 1 | x | x | − |
| 1 | 1 | x | x | + |
| 0 | 0 | 0 | 0 | + |
| U | x | x | x | − |

METHOD AND APPARATUS FOR DETERMINING THE MAINTENANCE AND CHARGE CONDITION OF LEAD STORAGE BATTERIES

BACKGROUND OF THE INVENTION

This invention relates to storage batteries in general and more particularly a method and apparatus for determining the maintenance and charge condition of lead storage batteries.

One common testing method for checking the condition, for instance, of a motor vehicle battery, such as is practiced at any filling station, consists of measuring the no-load voltage of the battery, followed if necessary by measuring its terminal voltage under load. If the measurement of the no-load voltage shows that the battery is insufficiently charged, no further information can be obtained regarding the condition of the battery by measuring the terminal voltage under load. The battery must first be recharged.

A measurement of the acid density, which can also be made, can furnish further indications of the condition of the battery, but such a measurement with a hydrometer is difficult to incorporate into the computer diagnosis now performed by many motor vehicle garages.

SUMMARY OF THE INVENTION

It is an object of the present invention to provide a method for determining the maintenance and charge condition of a lead storage battery, by means of which information is obtained regarding the maintenance condition of the battery even if it is insufficiently charged. This object is achieved, according to the present invention, by a method having the following steps which are executed sequentially:

(a) comparison of the no-load terminal voltage of the storage battery with a first reference voltage and with a second reference voltage higher than the first, with storage of the results of the comparison;

(b) comparison of the terminal voltage toward the end of a heavy current load period on the storage battery of about 15 sec. duration with a third reference voltage and storage of the result of the comparison;

(c) two comparisons of the no-load terminal voltage, with a mutual spacing of about 1 sec, about 100 msec after the end of the heavy current loading, with a fourth reference voltage and a fifth reference voltage higher than the fourth, and storage of the results of the comparison; and (d) evaluation of the stored comparison results in such a manner that, if the first reference voltage is not reached, the condition of the storage battery is indicated as bad; if the second to fifth reference voltages are not reached, the condition of the storage battery is indicated as good but in need of a charge, if the second and third reference voltages are exceeded, the condition is indicated as good and for all other comparison combinations, the condition of the storage battery is likewise indicated as bad.

The method according to the present invention is based on the discovery that the waveform of the recovery voltage after a heavy current load depends substantially on the maintenance condition of the storage battery. By determining the waveform of the recovery voltage by means of two succeeding instantaneous value measurements and combining the measurement results with the no-load voltage measurements and the voltage measurement under heavy current load, valid information regarding the maintenance condition of the battery can be obtained even if it is insufficiently charged.

It is advisable to consider, in the method according to the present invention, an equality of a reference voltage with a corresponding measured value as falling below the reference voltage.

The third reference voltage depends on the respective ampere-hour capacity of the battery being examined. It is therefore advisable that it be settable. The third reference voltage should also be adjustable in dependence on the temperature if batteries are to be tested at extreme temperatures.

One circuit arrangement for carrying out the method according to the invention is characterized by at least one comparator with inputs respectively for the terminal voltage of the battery under test, the reference voltages and timing signals from a timing control unit, as well as an output for a comparison result storage device and an evaluation logic circuit which is likewise time controlled and connected to outputs of the storage devices, and three indicating or recording units connected to corresponding outputs of the logic circuit for the test results "good", "bad", and "needs charging".

DETAILED DESCRIPTION OF THE INVENTION

Figures 1, 2:
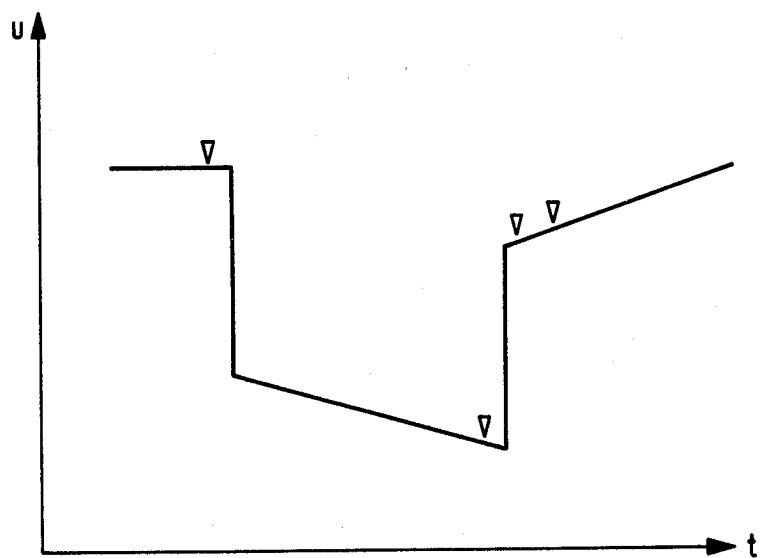
FIG. 1 is a timing diagram of the terminal voltage of the storage battery present in the course of the procedure of the present invention.
FIG. 2 is a diagram of the logical decisions for different test cases, as stored in the comparison decision storage devices.

In the diagram of FIG. 1, time is plotted along the abscissa and the terminal voltage of the battery under test along the ordinate. In schematic presentation, a voltage curve is obtained, the left-hand, horizontal part of which corresponds to the no-load terminal voltage. If the battery is loaded with heavy current, a voltage drop results which consists of an initially steep branch with a somewhat flatter branch following. After the heavy current load, the terminal voltage rises steeply again and then rises less steeply over a period of time. The measurement points on the voltage curve are indicated by arrows. The duration of the heavy current load period is about 15 sec. The measurement of the terminal voltage under heavy current load takes place about 100 msec before the end of the heavy current load period. The first measurement during the recovery of the battery is performed about 100 msec after the end of the heavy current loading. The second measurement in the recovery phase follows at a spacing of about one second from the first measurement.

In the diagram of FIG. 2, possible results of the measurement are entered in a matrix-like arrangement, the columns of which correspond to the successive measurements in the course of the terminal voltage curve, and the rows of which correspond to different conditions of the battery. In this connection, 0 means that the respective reference voltage was just reached or not reached; 1 means that the reference voltage was exceeded. Measurement points which can be ignored because of an unequivocal result of preceding measurement points are marked with X. In the last line of the diagram, a measurement is recoded, in which the comparison with the first reference voltage initially showed that the storage battery is bad. In the column farthest to the right, the result of the diagnosis of the respective decision combination is recorded. It can be seen that with the exception of the of the result obtained from rows E and F, the other columns show unsatisfactory findings as to the maintenance condition of the storage battery. In row E, a well maintained and charged battery is seen. Row F indicates a battery in good condition but which is in need of recharging.

Figure 3:
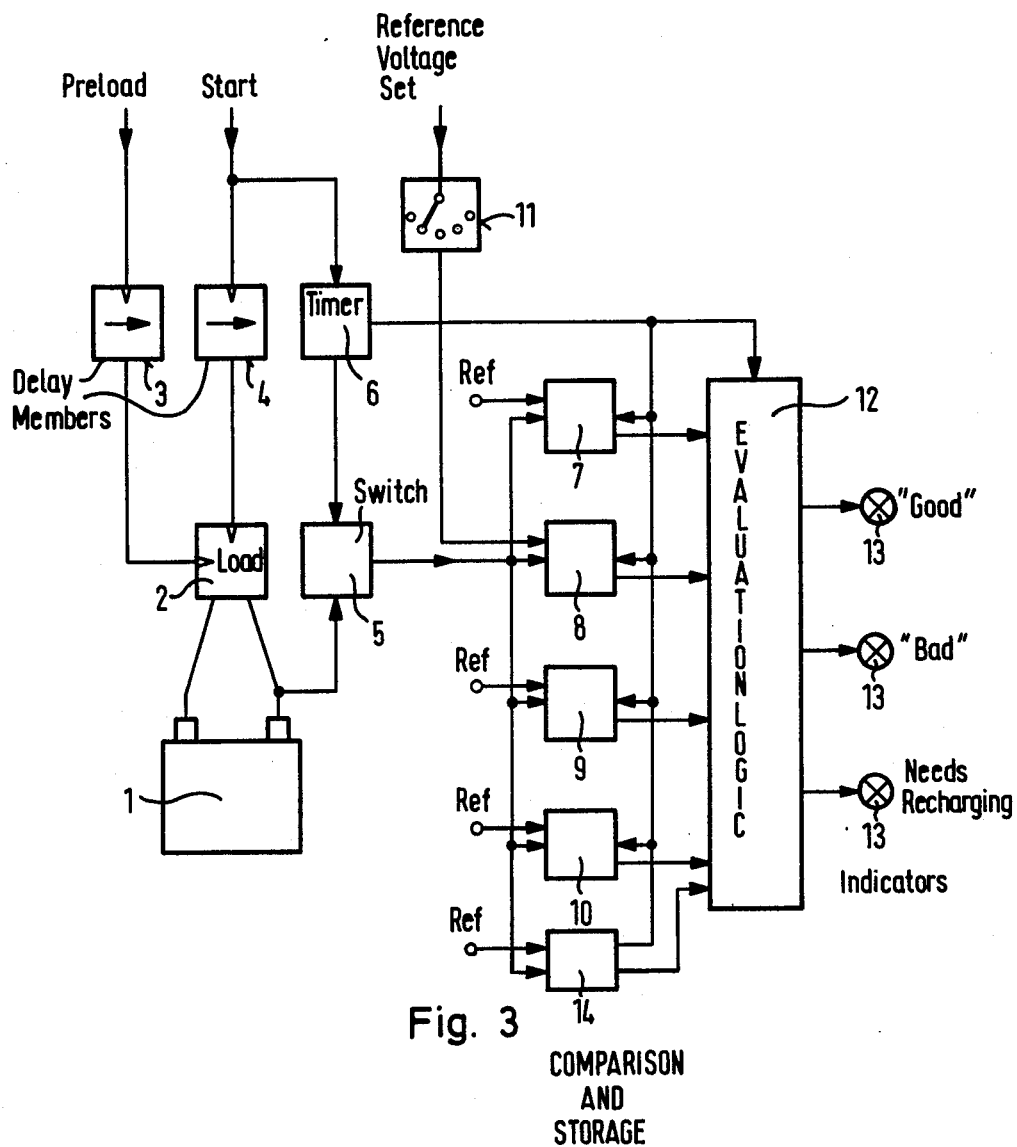
FIG. 3 is a block diagram of a circuit arrangement for implementing the method of the present invention.
Figure 4:
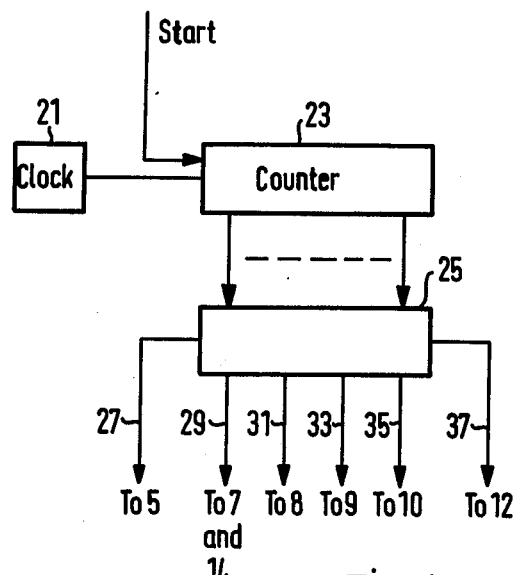
FIG. 4 is a block diagram of the timer of FIG. 3.

In FIG. 3, a block diagram of a circuit arrangement for implementing the method is shown. A loading device 2 is connected to the terminals of a storage battery 1 to be tested. The load consists substantially of a switch that can be operated via a relay, and a load resistor. The loading device 2 is operated via a time delay member 3 and a second time delay member 4. Operation via the time delay device 3 is used to switch to an initial load. The initial load becomes necessary if the storage battery 1 had been charged just before the test. Both the time delay members 3 and 4 may be monostable multivibrators. The delay member 3 will be used to place a preload on the battery where the battery has just been charged. Normal operation is in response to a start command which fires the monostable multivibrator 4 to operate a relay in the load device 2 to close a switch and place a resistor across the battery. Also provided is a switching device 5 which is connected to the positive terminal of the battery 1. This is operated by a timer 6 to be described below. The timer 6 is started in response to the start command. One output of the switching device 5, which carries the terminal voltage at the plus terminal of the storage battery 1, is connected in parallel to one input of each of five comparators 7, 8, 9, 10 and 14. Second inputs of the comparators 7 to 10 and 14 are connected to different respective reference voltages. The reference voltage input of the comparator 8 can be connected to different reference voltage sources depending on the capacity of the respective battery to be tested via a selector switch 11. Control inputs of the comparators 7, 8, 9, 10 and 14 are connected via a control line to additional outputs of the timing unit 6. The timing generator is shown on FIG. 4. In essence, it includes a clock 21 the output of which is the input to a counter 23. Since the smallest interval to be used is 100 milliseconds, this can be the period of the clock pulses. The counter has its outputs coupled into a decoder 25 for providing the various outputs required. The first output on line 27 is provided to the switch 5 causing it to close to connect the battery terminal to the various comparators. A short time thereafter an output on line 29 is provided to the comparators 7 and 14. The comparator 14 is one of the two comparators used in the initial measurement. It is set to a lower voltage than the comparator 7. The comparator 7 voltage corresponds essentially to a voltage slightly below that shown on FIG. 1 for the first measurement point. If the battery voltage is below the reference set into the comparator 14 the battery is bad. This corresponds to the row G of FIG. 2 where it was indicated that the initial determination indicated a bad battery. Approximately 15 seconds after the output on line 29 an output on line 31 is provided to the comparator 8. This takes the second measurement shown on FIG. 1. Approximately 200 milliseconds thereafter an output is provided on line 33 to the comparator 9 and one second thereafter an output on line 35 to the comparator 10. Finally, an output is provided on line 37 at a time thereafter to enable the evaluation logic 12 to be described below. Contained in the comparators 7 to 10 and 14 are storage devices for storing the digital decision results of the comparators. The outputs of the storage devices are connected to corresponding inputs of the evaluation logic circuit 12 which is also addressed by the signals of the timing unit. Indicator lamps 13, which indicate the result of the test of the storage battery 1, are connected to three outputs of the evaluation logic circuit 12. The three lamps 13 are provided for the results "good", "bad" and "needs charging". After the storage battery 1 is connected for testing, a no-load voltage measurement is made via a start signal which sets the timing device in operation, and the result is registered in the storage device associated with the comparator 7. Then, the storage battery 1 is loaded for 15 seconds by means of the loading device 2. Toward the end of the loading time, a measurement of the terminal voltage is made, controlled by the timing unit, and the result is stored in the storage device of the comparator 8. After the load is disconnected, the comparator 9 is connected to the terminal voltage of the storage battery 1 via the switching device 5. The result of the measurement is likewise stored in the storage device associated with the comparator 9. After about 1 second, the terminal voltage is connected to the comparator 10 and the result held in the storage device associated with it. The evaluation logic 12 then combines the stored digital values in accordance with the scheme of FIG. 2 and indicates by the lamps 13 the condition of the storage battery 1. A printing device for the results can also be connected instead of the lamps 13.

Figure 5:
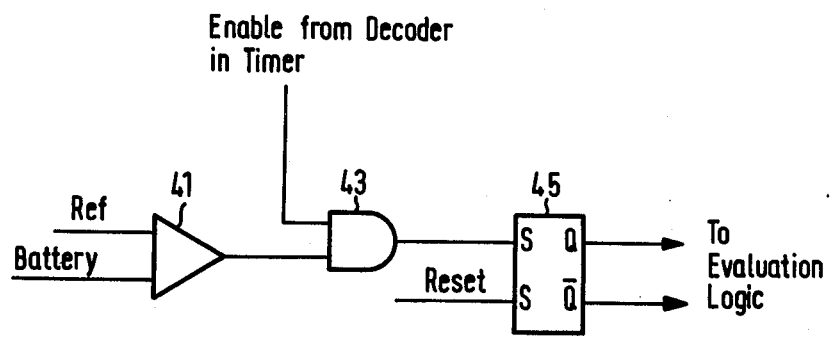
FIG. 5 is a block diagram of one of the comparators and storage means of FIG. 3.

A typical construction of each of the comparators 7–10 and 14 is shown on FIG. 5. Included is a comparator circuit 41 having as inputs the respective reference voltage and the battery voltage from the switch 5. The output of the comparator circuit 41 is coupled through an AND gate 43 which is enabled by one of the respective decoder 25 outputs of FIG. 4. The AND gate output is an input to a set/reset flip flop 45. If the battery voltage exceeds the respective reference voltage, when the gate 43 is enabled a logical 1 will be present at the output thereof to set the flip flop 45 to store that indication. Otherwise the flip flop remains reset. It should be noted that a conventional reset is used to reset all flip flop and also to reset the counter 23 prior to start up.

Figure 6:
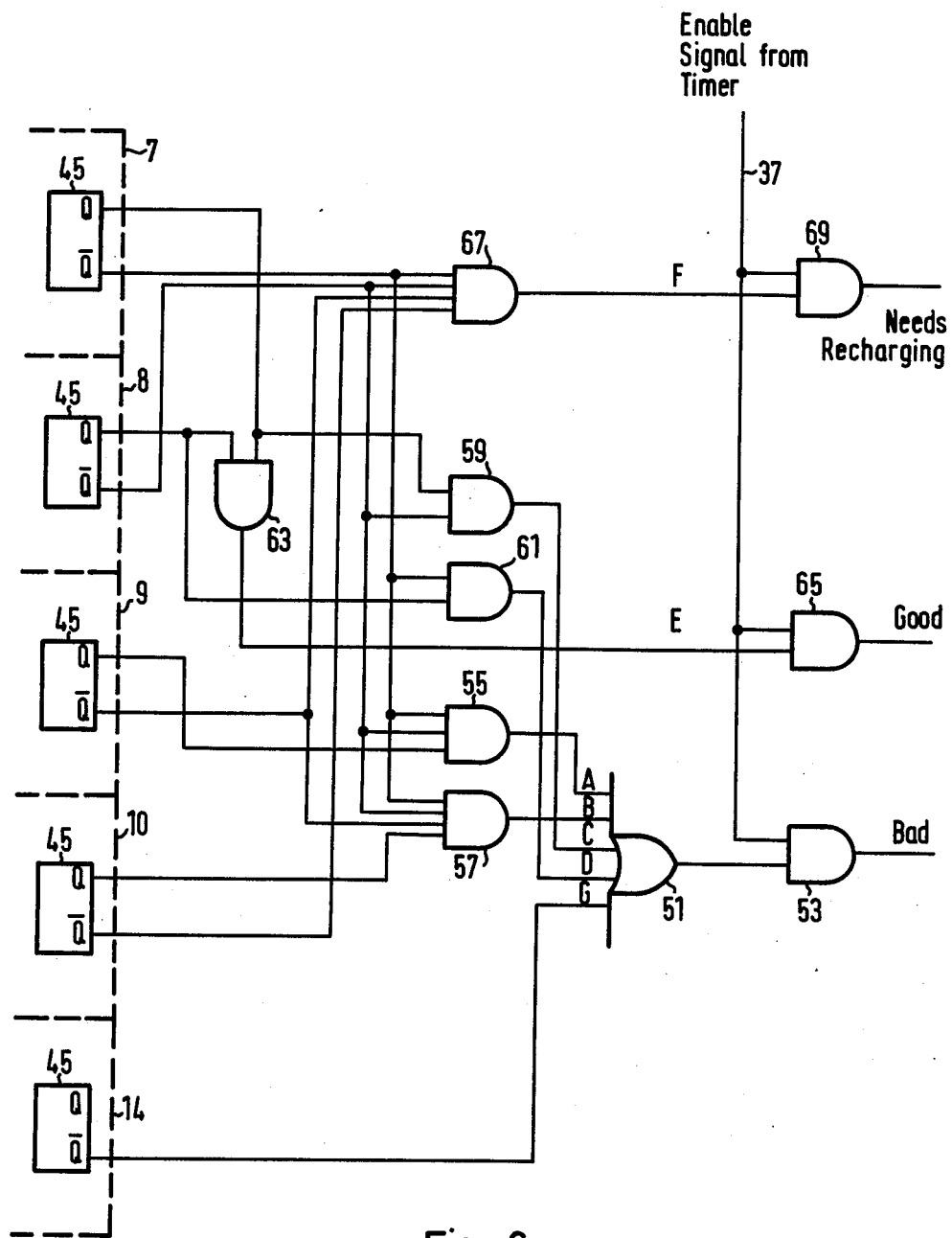
FIG. 6 is a logic diagram showing the decision logic of FIG. 3.

The evaluation logic is illustrated on FIG. 6. Shown on the left-hand portion of the figure are the flip flops 45 in each of the comparators 7–10 and 14. With reference to FIG. 2 it will be noted that if the lower voltage in the initial comparison is not exceeded the flip flop in the unit 14 will remain reset and a $\bar{Q}$ output will be a logical "1". This indicates a bad battery. This output is coupled into an Or gate 51 the output of which is one input to an AND gate 53 which is enabled by the signal on line 37 from decoder 25 of FIG. 4. Again, with reference to FIG. 2, line A thereof indicates that if the first comparison is "0" the second comparison "0" and third comparison "1" the battery is bad. These respective conditions obtained from the storage flip flops 45 are the inputs to an And gate 55 the output of which is an additional input to the Or gate 51. Similarly the conditions listed in line B are the inputs to an And gate 57 also having its output coupled as an input to Or gate 51. The condition of line C are inputs to an And gate 59, the output of this gate also being an input to Or gate 51. Finally, the conditions associated with line D are inputs to an And gate 61 having its output coupled as a further input to Or gate 51. The "good" condition listed in row E of FIG. 2 is detected by means of an And gate 63 the output of which is coupled to a further And gate 65 enabled by the signal on line 37. Finally, the condition of row F, i.e., the condition indicating that the battery need recharging, is obtained utilizing an And gate 67 the output of which is coupled through an And gate 69 enabled by the signal on line 37. It can be seen that, after the sequential measurements are made in the comparators 7–10 and 14 and results stored in their flip flops 45, when the enabling signal appears on line 37, then one of the And gates 53, 65 and 69 will be enabled to indicate the status of the battery and an appropriate output will be provided to one of the lamps 13 of FIG. 3.

What is claimed is:

1. A method for determining the maintenance and charge condition of lead storage batteries comprising the steps of:
   a. comparing the no load terminal voltage of the storage battery with a first reference voltage and with a second reference voltage higher than the first and storing the results of the comparisons;
   b. placing a heavy load on the storage battery and comparing the terminal voltage after said load has been maintained for approximately 15 seconds with a third reference voltage and storing the results of the comparison;
   c. after removal of the load making two comparisons of the terminal voltage respectively with fourth and fifth reference voltages respective, the fifth reference voltage being higher than the fourth, the first of said two comparisons being carried out approximately 100 msec after removal of the load and the second of said two comparisons approximately 1 second after the first of the two and storing the results of said comparisons; and
   d. evaluating the stored results and providing an output indicating that the battery is bad if said first reference voltage is not reached, that the battery is good but in need of charging if the second to fifth reference voltages are not reached, that it is good if the second and third reference voltages are exceeded and also indicating for all other combinations that the condition of the battery is bad.

2. The method according to claim 1 wherein said comparisons are carried out such that where the measured value is equal to the reference value the measured value is considered as falling below the reference value.

3. The method according to claim 2 and further including the step of setting the third reference voltage in dependence on the ampere-hour capacity of the battery.

4. The method according to claim 1 and further including the step of setting the third reference voltage in dependence on the ampere-hour capacity of the battery.

5. The method according to claim 1 and further including the step of setting the third reference voltage in dependence temperature of the battery.

6. The method according to claim 2 and further including the step of setting the third reference voltage in dependence on the temperature of the battery.

7. A circuit for determining the maintenance and charge condition of lead storage batteries comprising:
   a. a first comparator having as one input a first reference voltage;
   b. a second comparator having as one input a second reference voltage higher than said first reference voltage;
   c. a third comparator having as one input a third reference voltage;
   d. a fourth comparator having as one input fourth reference voltage;
   e. a fifth comparator having as one input a fifth reference voltage higher than said fourth reference voltage;
   f. first, second, third, fourth and fifth storage means having their inputs coupled respectively to the output of said first, second, third, fourth and fifth comparators;
   g. means for coupling the terminal voltage of the battery as second inputs to each of said first, second, third, fourth and fifth comparators;
   h. means for placing a load across said battery;
   i. evaluation logic means having as its inputs the outputs of said first, second, third, fourth and fifth storage means for evaluating the outputs thereof such that if said outputs indicate that the first reference voltage has not been reached the condition of the battery is indicated as bad, if the second to fifth reference voltages are not reached the condition of the battery is indicated as good but in need of charging, if the second and third reference voltages are exceeded the condition of the battery is indicated as good and for all other combinations the condition of the storage battery is indicated as bad;
   j. indicating means coupled to the output of said logic means for giving a visual indication of said conditions of good, bad and in need of charging; and
   k. timing means for sequentially enabling said first and second comparators to make an initial comparison of the terminal voltage of the battery; placing said load across said battery; enabling said third comparator to make a comparison of said terminal voltage after said load has been applied for approximately 15 seconds; removing said load; enabling said fourth comparator to make a comparison of said terminal voltage and store the results approximately 100 msec later; enabling said fifth comparator to make a comparison and store the results approximately 1 second later; and thereafter enabling said evaluation logic circuit to evaluate the stored result and provide an output to said indicating means.

8. Apparatus according to claim 7 and further including means for adjusting the reference voltage provided to said third comparator.

* * * * *